(12) United States Patent
Tsuchiya

(10) Patent No.: US 8,664,960 B2
(45) Date of Patent: Mar. 4, 2014

(54) CHARGED STATE ESTIMATING DEVICE AND CHARGED STATE ESTIMATING METHOD OF SECONDARY BATTERY

(75) Inventor: Kenji Tsuchiya, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 364 days.

(21) Appl. No.: 13/067,785

(22) Filed: Jun. 27, 2011

(65) Prior Publication Data
US 2011/0257914 A1 Oct. 20, 2011

Related U.S. Application Data

(62) Division of application No. 12/086,696, filed as application No. PCT/JP2006/324409 on Nov. 30, 2006, now Pat. No. 8,274,291.

(30) Foreign Application Priority Data

Dec. 27, 2005 (JP) ................................. 2005-375730

(51) Int. Cl.
*G01V 3/18* (2006.01)
*H02J 7/00* (2006.01)

(52) U.S. Cl.
USPC ........... 324/426; 324/425; 320/148; 320/149; 320/150

(58) Field of Classification Search
USPC .......... 324/426, 429, 425; 320/148, 149, 150, 320/161, 104, 136, 137, 134
See application file for complete search history.

(56) References Cited

U.S. PATENT DOCUMENTS 5,412,323 A * 5/1995 Kato et al. ..................... 324/429
5,872,453 A * 2/1999 Shimoyama et al. ......... 324/431
(Continued)

FOREIGN PATENT DOCUMENTS

EP  1 271 170 A2  1/2003
JP  A-06-331714  12/1994
(Continued)

OTHER PUBLICATIONS

Jul. 13, 2012 Supplementary European Search Report issued in European Patent Application No. 06834164.3.
(Continued)

*Primary Examiner* — Edward Tso
*Assistant Examiner* — Alexis Boateng
(74) *Attorney, Agent, or Firm* — Oliff PLC

(57) ABSTRACT

When a battery current is not larger than a limit current set depending on the battery temperature and is flowing continuously for a predetermined time set depending on the battery temperature or longer, a decision is made that a secondary battery is in stable state. When the secondary battery is in stabilized state, the battery voltage is considered to be equal to the open circuit voltage and SOC estimation is performed based on the open circuit voltage-SOC characteristics. When the product of the internal resistance of the secondary battery and the limit current is made substantially constant (constant voltage) by setting the limit current in association with temperature dependence of the internal resistance, estimation error can be kept within a predetermined range in the stabilized state even if SOC estimation is performed while the battery voltage is assumed as the open circuit voltage. Consequently, SOC can be estimated with high precision within a predetermined error by a simple and reliable system under stabilized state.

12 Claims, 7 Drawing Sheets

(56) References Cited

U.S. PATENT DOCUMENTS

| | | | |
|---|---|---|---|
| 5,945,808 A * | 8/1999 | Kikuchi et al. | 320/132 |
| 5,982,152 A * | 11/1999 | Watanabe et al. | 320/150 |
| 6,134,457 A * | 10/2000 | Ha et al. | 455/572 |
| 6,285,163 B1 | 9/2001 | Watanabe et al. | |
| 6,313,606 B1 | 11/2001 | Eguchi | |
| 6,366,054 B1 | 4/2002 | Hoenig et al. | |
| 6,417,668 B1 | 7/2002 | Howard et al. | |
| 6,794,876 B2 | 9/2004 | Kawaguchi et al. | |
| 7,053,588 B2 * | 5/2006 | Nakanishi et al. | 320/104 |
| 7,136,762 B2 * | 11/2006 | Ono | 702/63 |
| 7,443,139 B2 | 10/2008 | Mitsui et al. | |
| 7,477,038 B2 | 1/2009 | Taniguchi | |
| 7,898,262 B2 * | 3/2011 | Kubo et al. | 324/427 |
| 2002/0145430 A1 | 10/2002 | Arai et al. | |
| 2003/0016022 A1 * | 1/2003 | Ziegler | 324/426 |
| 2003/0169049 A1 | 9/2003 | Kawaguchi et al. | |
| 2004/0078155 A1 * | 4/2004 | Thibedeau et al. | 702/63 |
| 2007/0035307 A1 | 2/2007 | Schoch | |

FOREIGN PATENT DOCUMENTS

| | | |
|---|---|---|
| JP | A-11-307137 | 11/1999 |
| JP | A-2000-150003 | 5/2000 |
| JP | A-2000-306613 | 11/2000 |
| JP | A-2003-307556 | 10/2003 |
| WO | WO 2004/068157 A1 | 8/2004 |

OTHER PUBLICATIONS

V. Pop et al. "State-of-Charge Indication in Portable Applications." IEEE ISIE 2005, pp. 1007-1012.

Mar. 13, 2007 International Search Report issued in PCT/JP2006/324409.

May 27, 2011 Restriction Requirement issued in U.S. Appl. No. 12/086,696.

Dec. 20, 2011 Office Action issued in U.S. Appl. No. 12/086,696.

Sep. 2, 2011 Office Action issued in US Appl. No. 12/086,696.

* cited by examiner

CHARGED STATE ESTIMATING DEVICE AND CHARGED STATE ESTIMATING METHOD OF SECONDARY BATTERY

This is a Division of Application No. 12/086,696 filed Jun. 18, 2008, which in turn is a National Phase of Application No. PCT/JP2006/324409 filed Nov. 30, 2006. The disclosure of the prior applications is hereby incorporated by reference herein in its entirety.

DESCRIPTION

1. Technical Field

The present invention relates to device and method of estimating charged state of a secondary battery and, more specifically, to device and method of estimating charged state of a secondary battery that successively calculate SOC (State Of Charge) indicating remaining capacity (charge percentage) of the secondary battery.

2. Background Art

A power supply system has been used, which is structured to supply power to load equipment from a rechargeable secondary battery and to allow charging of the secondary battery even during an operation of the load equipment. Such a power supply system is typically mounted on a hybrid vehicle or an electric vehicle having, as one of vehicle driving power sources, an electric motor driven by a secondary battery.

In the power supply system for a hybrid vehicle, electric power stored in the secondary battery is used as driving electric power of an electric motor for driving the vehicle, and the secondary battery is charged by the power regenerated by the electric motor or by the power generated by a power generator generating electric power as the engine rotates. In such a power supply system, it is necessary to know the charged state (representatively, SOC indicating charge percentage with respect to full-charge) of the secondary battery and to avoid severe state of use that may cause battery deterioration. Specifically, it is necessary to limit output of the electric motor for driving the vehicle that receives an output from the secondary battery and to generate a request for charging the secondary battery or a command to inhibit charging/discharging, based on the estimated value of remaining capacity and, therefore, highly accurate estimation of the remaining capacity is essential.

Conditions of use and output of the secondary battery, however, vary widely as represented by the conditions when it is mounted on a hybrid vehicle, and under the state of use in which charging/discharging is repeatedly executed with relatively high power density, it is generally difficult to estimate the remaining capacity. Thus, improvement in estimation accuracy has been a problem.

In view of the foregoing, in addition to the most basic procedure of successively calculating the amount of change in the remaining capacity based on the integration of input/output current, various procedures for estimating the remaining capacity with high accuracy have been proposed.

By way of example, Japanese Patent Laying-Open No. 2000-306613 (hereinafter referred to as Patent Document 1) discloses a battery state monitoring device in which an internal resistance of a secondary battery is calculated from the relation between battery current (charging/discharging current) and battery voltage (voltage across terminals) measured during use of the battery, an open circuit voltage (OCV) is calculated using the battery current/voltage and the calculated internal resistance, and the battery capacity (SOC) is estimated from the open circuit voltage. Further, in the battery state-monitoring device, if the battery current goes out of or deviates from a prescribed range, the battery capacity (SOC) is estimated by adding, to the battery capacity (SOC) immediately before the deviation, integrated value of battery current after the deviation. Specifically, according to Patent Document 1, the method of estimation is changed dependent on the range of battery current, to improve estimation accuracy.

Similarly, Japanese Patent Laying-Open No. 2000-150003 (hereinafter referred to as Patent Document 2) discloses a charged amount calculating device supporting an SOC calculating procedure based on battery current integration and other SOC calculating procedures. In the charged amount calculating device, the SOC calculating procedure to be used is determined based on a difference between the SOC calculating procedure based on battery current integration and other procedures.

In the battery state monitoring device disclosed in Patent Document 1, the internal resistance that successively changes along with charging/discharging is calculated using inclinations of a plurality of sets of battery voltage and battery current measured during charging/discharging.

It has been known, however, that the change in battery voltage (voltage across terminals) of the secondary battery during charging/discharging delays from the change in battery current. Specifically, when a constant battery current starts to flow or when the battery current stops, the battery voltage is not in a stable state but fluctuates until after a prescribed time period referred to as relaxation time. Therefore, if the battery voltage is measured before the lapse of relaxation time, accurate output voltage of the secondary battery cannot be measured.

Further, the range in which linearity in accordance with the internal resistance appears between the battery current and the battery voltage also changes dependent on the temperature range of the secondary battery. By way of example, in a lithium ion secondary battery, linearity between the battery current and the battery voltage hardly appears at a low temperature range, because of decrease in ion-exchange current density at an electrode surface.

In this connection, though Patent Document 1 discloses that the procedure of estimation based on the calculation of internal resistance and the procedure of estimation based on battery current integration are switched in accordance with the range of the battery current, SOC estimation focused on the temperature condition of the secondary battery or the duration of battery current is not performed. Therefore, it is possible that estimation of open circuit voltage and hence, estimation of remaining capacity (SOC) of the secondary battery involves an error derived from an error in estimating the internal resistance.

Further, in the charged amount calculating device for a hybrid vehicle disclosed in Patent Document 2, switching among a plurality of SOC calculating procedures is determined based on a battery current range and a difference between the SOC value calculated based on battery current integration and the SOC value calculated by other procedure. Therefore, though the SOC calculating procedure based on battery current integration can be switched to other SOC calculating procedure immediately when the battery current becomes low, after a large current flows at a low temperature in which internal resistance is high, there is undeniably a possibility of large error in SOC estimation because of the error in estimating the internal resistance, from the same reason as described with respect to Patent Document 1. Further, the temperature condition of secondary battery and the duration of battery current related to SOC estimation are not sufficiently considered, either. Therefore, the estimation of remaining capacity (SOC) may possibly involve an error.

DISCLOSURE OF THE INVENTION

The present invention was made in order to solve the above-described problems, and the object of the present invention is to apply an appropriate SOC estimating method in consideration of the state of use of the secondary battery and thereby to improve estimation accuracy.

The present invention provides a device for estimating charged state of a secondary battery provided with a detector that can detect input/output current, an output voltage and battery temperature, including characteristic storing means, stable state determining means, and a first charged state estimating means. The characteristic storing means stores characteristic between the open circuit voltage and remaining capacity of the secondary battery. The stable state determining means determines whether it is a stable state in which the input/output current is maintained not higher than a limit current set in accordance with the battery temperature for at least a voltage stabilizing period set in accordance with the battery temperature or not. The first charged state estimating means estimates the remaining capacity of the secondary battery based on the characteristic stored in the characteristic storing means, regarding the output voltage as the open circuit voltage, when it is determined to be the stable state.

The present invention provides a method of estimating charged state of a secondary battery provided with a detector that can detect input/output current, an output voltage and battery temperature, including the stable state determining step and the first charged state estimating step. At the stable state determining step, whether it is a stable state in which the input/output current is maintained not higher than a limit current set in accordance with the battery temperature for at least a voltage stabilizing period set in accordance with the battery temperature or not is determined. At the first charged state estimating step, the remaining capacity of the secondary battery is estimated based on characteristic between open circuit voltage and remaining capacity of the secondary battery, regarding the output voltage as the open circuit voltage of the secondary battery, when it is determined to be the stable state. At the second charged state estimating step, the remaining capacity of the secondary battery is estimated based on a procedure different from that of the first charged state estimating step, when it is determined not to be the stable state.

According to the device or method of estimating charged state of the secondary battery described above, when the output voltage of the secondary battery is stable and voltage change in the internal resistance is small (stable state), the output voltage is regarded as the open circuit voltage, and the SOC of secondary battery is estimated with reference to the open circuit voltage-remaining capacitance (SOC) characteristic. Here, the stable state mentioned above is determined in consideration of the relaxation time (voltage stabilizing time) and the change in internal resistance dependent on temperature. Therefore, particularly in a secondary battery having high correlation between the open circuit voltage and the remaining capacity, in the stable state, SOC can be estimated with high accuracy with the error being within a prescribed range, by a simple and reliable method.

Preferably, the device for estimating charged state of a secondary battery in accordance with the present invention further includes second charged state estimating means for estimating the remaining capacity of the secondary battery when it is determined not to be the stable state by the stable state determining means. The second charged state estimating means estimates the remaining capacity of the secondary battery by a procedure of successively calculating amount of change in the remaining capacity based on an integrated value of the input/output current or a procedure based on a battery model using the input/output current, the output voltage and the battery temperature as input variables.

Preferably, the method of estimating charged state of a secondary battery in accordance with the present invention further includes the second charged state estimating step of estimating the remaining capacity of the secondary battery when it is determined not to be the stable state at the stable state determining step. At the second charged state estimating step, the remaining capacity of the secondary battery is estimated by a procedure of successively calculating amount of change in the remaining capacity based on an integrated value of the input/output current or a procedure based on a battery model using the input/output current, the output voltage and the battery temperature as input variables.

According to the device or method of estimating charged state of a secondary battery described above, other than in the stable state, the SOC of the secondary battery can be estimated with high accuracy by the procedure based on battery model expression or the procedure based on current integration.

More preferably, in the device for estimating charged state of a secondary battery in accordance with the present invention, the second charged state estimating means includes first estimating means for estimating the remaining capacity of the secondary battery by calculating amount of change in the remaining capacity based on an integrated value of the input/output current, second estimating means for estimating the remaining capacity of the secondary battery based on the battery model using the input/output current, the output voltage and the battery temperature as input variables, and timer means for measuring duration of continuous execution of the estimation of remaining capacity by the first estimating means. Further, the second charged state estimating means estimates the remaining capacity by selecting the first estimating means when the duration of continuous execution is within a first limit time period, and estimates the remaining capacity by selecting the second estimating means when the duration of continuous execution exceeds the first limit time period and the input/output current is in a prescribed range that allows use of the battery model.

Further, more preferably, in the method of estimating charged state of a secondary battery in accordance with the present invention, the second charged state estimating step includes the first estimating step of estimating the remaining capacity of the secondary battery by calculating amount of change in the remaining capacity based on an integrated value of the input/output current, the second estimating step of estimating the remaining capacity of the secondary battery based on the battery model using the input/output current, the output voltage and the battery temperature as input variables, and the time measuring step of measuring duration of continuous execution of the estimation of remaining capacity by the first estimating step. At the second charged state estimating step, the remaining capacity is estimated by selecting the first estimating step when the duration of continuous execution is within a first limit time period, and estimates the remaining capacity by selecting the second estimating step when the duration of continuous execution exceeds the first limit time period and the input/output current is in a prescribed range that allows use of the battery model.

According to the device or method of estimating charged state of a secondary battery described above, when the SOC estimation based on current integration is executed continuously for a limited time period (first limit time period) or longer, estimation of the remaining capacity based on the battery model can be executed, provided that the input/output current is within the range that allows use of the current model. Accordingly, increase in SOC estimation error resulting from continuous SOC estimation based on current integration for a long period of time, due to detection error (offset) of the current sensor, can be prevented. Further, when the input/output current is out of the range that allows use of the battery model, selection of SOC estimation based on the battery model is not forced. Therefore, increase in estimation error caused by selection of an inappropriate method of SOC estimation can be avoided.

More preferably, in the device for estimating charged state of a secondary battery in accordance with the present invention, the second charged state estimating means estimates the remaining capacity by selecting the second estimating means, when the duration of continuous execution exceeds a second limit time period longer than the first limit time period, regardless of the input/output current.

According to the device for estimating charged state of a secondary battery described above, when the SOC estimation based on current integration is continued exceeding the limit (the second limit time period), it is possible to once execute the SOC estimation based on the battery model. Therefore, SOC estimation can be executed such that SOC estimation error derived from detection error (offset) of the current sensor does not exceed the tolerable value.

Particularly, in the device for estimating charged state of a secondary battery in accordance with the present invention, the second charged state estimating means estimates the remaining capacity by selecting the first estimating means, when the duration of continuous execution exceeds the first limit time period and the input/output current is out of the prescribed range that allows use of the battery model.

According to the device for estimating charged state of a secondary battery described above, when the SOC estimation based on current integration is continued exceeding the limit time period (the first limit time period), SOC estimation based on the battery model expression is executed only when the input/output current is in the range that allows use of the battery model. Therefore, the SOC error attaining a large value as a result of forced execution of the SOC estimation based on the battery model can be prevented.

Preferably, in the device for estimating charged state of a secondary battery in accordance with the present invention, the limit current in the stable state determining means is set relatively large as the battery temperature increases.

Preferably, in the method of estimating charged state of a secondary battery in accordance with the present invention, the limit current at the stable state determining step is set relatively large as the battery temperature increases.

According to the device or method of estimating charged state of a secondary battery described above, the fact that the internal resistance of the secondary battery lowers as the battery temperature increases and on the contrary, the internal resistance increases as the battery temperature decreases is taken into consideration, so that the limit current can be set to have voltage change caused by the internal resistance in the stable state not exceeding a prescribed voltage. Therefore, estimation error involved in SOC estimation regarding the output voltage of the secondary battery as the open circuit voltage can be curbed within a prescribed range.

Preferably, in the device for estimating charged state of a secondary battery in accordance with the present invention, the voltage stabilizing period in the stable state determining means is set relatively short as the battery temperature increases.

Preferably, in the method of estimating charged state of a secondary battery in accordance with the present invention, the voltage stabilizing period at the stable state determining step is set relatively short as the battery temperature increases.

According to the device or method of estimating charged state of a secondary battery described above, the fact that the relaxation time until the output voltage of the secondary battery is stabilized becomes shorter as the battery temperature increases and becomes longer as the battery temperature decreases is reflected, so that SOC estimation in which the voltage across terminals is regarded as the open circuit voltage in a state in which the output voltage is stabilized, can be executed.

According to another arrangement, the present invention provides a device for estimating charged state of a secondary battery provided with a detector that can detect input/output current, an output voltage and battery temperature, including first estimating means, second estimating means, timer means and selecting means. The first estimating means estimates the remaining capacity of the secondary battery by calculating amount of change in the remaining capacity based on an integrated value of the input/output current. The second estimating means estimates the remaining capacity of the secondary battery based on a battery model using the input/output current, the output voltage and the battery temperature as input variables. The timer means measures duration of continuous execution of the estimation of remaining capacity by the first estimating means. The selecting means selects one of the first and second estimating means for estimating the remaining capacity, based on determination as to whether the input/output current is within a prescribed range that allows use of a battery model or not and on the duration of continuous execution obtained by the timer means.

According to another aspect, the present invention provides a method of estimating charged state of a secondary battery provided with a detector capable of detecting input/output current, an output voltage and battery temperature, including the first estimating step, the second estimating step, the time measuring step and the selecting step. At the first estimating step, the remaining capacity of the secondary battery is estimated by calculating amount of change in the remaining capacity based on an integrated value of the input/output current. At the second estimating step, the remaining capacity of the secondary battery is estimated based on a battery model using the input/output current, the output voltage and the battery temperature as input variables. At the time measuring step, duration of continuous execution of the estimation of remaining capacity by the first estimating step is measured. At the selecting step, one of the first and second estimating steps of estimating the remaining capacity is selected based on determination as to whether the input/output current is within a prescribed range that allows use of the battery model or not and on the duration of continuous execution obtained by the time measuring step.

According to the device or method of estimating charged state of a secondary battery described above, the SOC can be estimated by selectively using the SOC estimation based on current integration and the SOC estimation based on battery model, taking into account the continuous execution time of the SOC estimation based on current integration and whether the input/output current is in the range that allows use of the battery model that ensures estimation accuracy attained by the battery model. Therefore, in the arrangement of SOC estimation executed by switching between the above-described two SOC estimation methods, increase in estimation error caused by selection of inappropriate SOC estimation method can be prevented, and SOC estimation accuracy can be improved.

Preferably, in the device for estimating charged state of a secondary battery in accordance with another arrangement of the present invention, the selecting means estimates the remaining capacity by selecting the first estimating means when the duration of continuous execution is within a first limit time period, and estimates the remaining capacity by selecting the second estimating means when the duration of continuous execution exceeds the first limit time period and the input/output current is in the prescribed range that allows use of the battery model.

Preferably, in the method of estimating charged state of a secondary battery in accordance with another aspect of the present invention, at the selecting step, the remaining capacity is estimated by selecting the first estimating step when the duration of continuous execution is within a first limit time period, and the remaining capacity is estimated by selecting the second estimating step when the duration of continuous execution exceeds the first limit time period and the input/output current is in the prescribed range that allows use of the battery model.

According to the device or method of estimating charged state of a secondary battery described above, if the SOC estimation based on current integration is continuously executed exceeding the limit time period (the first limit time period), the estimation of remaining capacity based on battery model can be executed, provided that the input/output current is in the range that allows use of the battery model. Accordingly, increase in SOC estimation error resulting from continuous SOC estimation based on current integration for a long period of time, due to detection error (offset) of the current sensor, can be prevented. Further, when the input/output current is out of the range that allows use of the battery model, selection of SOC estimation based on the battery model is not forced. Therefore, increase in estimation error caused by selection of an inappropriate method of SOC estimation can be avoided.

More preferably, in the device for estimating charged state of a secondary battery in accordance with another arrangement of the present invention, the selecting means estimates the remaining capacity by selecting the second estimating means, when the duration of continuous execution exceeds a second limit time period longer than the first limit time period, regardless of the input/output current.

According to the device for estimating charged state of a secondary battery described above, when the SOC estimation based on current integration is continued exceeding the limit (the second limit time period), it is possible to once execute the SOC estimation based on the battery model. Therefore, SOC estimation can be executed such that SOC estimation error derived from detection error (offset) of the current sensor does not exceed the tolerable value.

Alternatively, or preferably, in the device for estimating charged state of a secondary battery according to another arrangement of the present invention, the selecting means estimates the remaining capacity by selecting the first estimating means, when the duration of continuous execution exceeds the first limit time period and the input/output current is out of the prescribed range that allows use of the battery model.

According to the device for estimating charged state of a secondary battery described above, when the SOC estimation based on current integration is continued exceeding the limited time period (the first limit time period), SOC estimation based on the battery model expression is executed only when the input/output current is in the range that allows use of the battery model. Therefore, the SOC error attaining a large value as a result of forced execution of the SOC estimation based on the battery model can be prevented.

Preferably, in the application of the present invention, the secondary battery is a lithium ion battery.

According to the device for estimating charged state of a secondary battery described above, the remaining capacity (SOC) of the lithium ion battery having high correlation between the open circuit voltage and the remaining capacity can be estimated with high accuracy.

Therefore, by the device or method of estimating charged state of a secondary battery in accordance with the present invention, an appropriate SOC estimating method can be applied in accordance with the state of use of the secondary battery, whereby estimation accuracy can be improved.

BEST MODES FOR CARRYING OUT THE INVENTION

Figure 1:
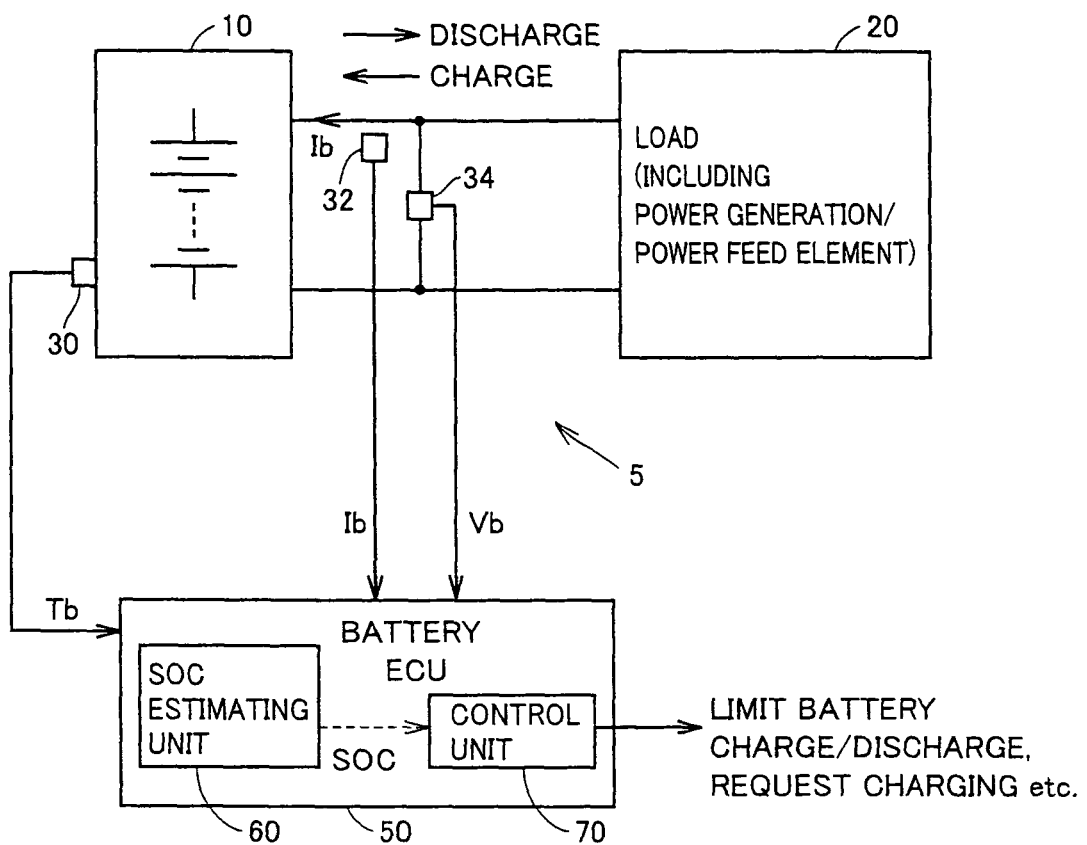
FIG. 1 is a schematic block diagram representing a configuration of a power supply system including a secondary battery, of which remaining capacity (SOC) is estimated by the device or method of estimating charged state of a secondary battery in accordance with an embodiment of the present invention.

In the following, embodiments of the preset invention will be described in detail with reference to the figures. In the following, the same or corresponding portions in the figures will be denoted by the same reference characters and basically, description thereof will not be repeated.

FIG. 1 is a schematic block diagram representing a configuration of a power supply system including a secondary battery, of which remaining capacity (SOC) is estimated by the device or method of estimating charged state of a secondary battery in accordance with an embodiment of the present invention.

Referring to FIG. 1, a power supply system 5 includes a secondary battery 10 and a load 20.

As a rechargeable secondary battery 10, typically a lithium ion battery is used. The type and form of the secondary battery, however, are not specifically limited. It is noted that a lithium ion battery has strong correlation between the open circuit voltage (OCV) and the remaining capacity (SOC), and therefore, the present invention is suitably applicable.

On secondary battery 10, a temperature sensor 30 measuring the battery temperature Tb, a current sensor 32 measuring a current Ib (as input/output charging/discharging current of the secondary battery, hereinafter also referred to as battery current Ib), and a voltage sensor 34 measuring a voltage Vb across terminals of positive and negative electrodes (hereinafter also referred to as battery voltage Vb) are provided.

Load 20 is driven by an output electric power from secondary battery 10. It is assumed that a power generating/power feeding element, not shown, is provided inside of or separate from load 20, and that secondary battery 10 can be charged by a charging current from the power generating/power feeding element. Therefore, when secondary battery 10 is discharged, battery current Ib<0, and when secondary battery 10 is charged, battery current Ib>0.

An electronic control unit (ECU) 50 includes an SOC estimating unit 60 that corresponds to the "charged state estimating device", and a control unit 70. Control unit 70 limits/inhibits charging/discharging or generates charge request of secondary battery 10, based on the SOC (%) estimated by SOC estimating unit 60. ECU 50 is typically formed to include a microcomputer and a memory (RAM, ROM or the like) for executing a pre-programmed prescribed sequence and prescribed operations. Values detected by the group of sensors 30, 32 and 34 provided on secondary battery 10 are input to ECU 50.

Figure 2:
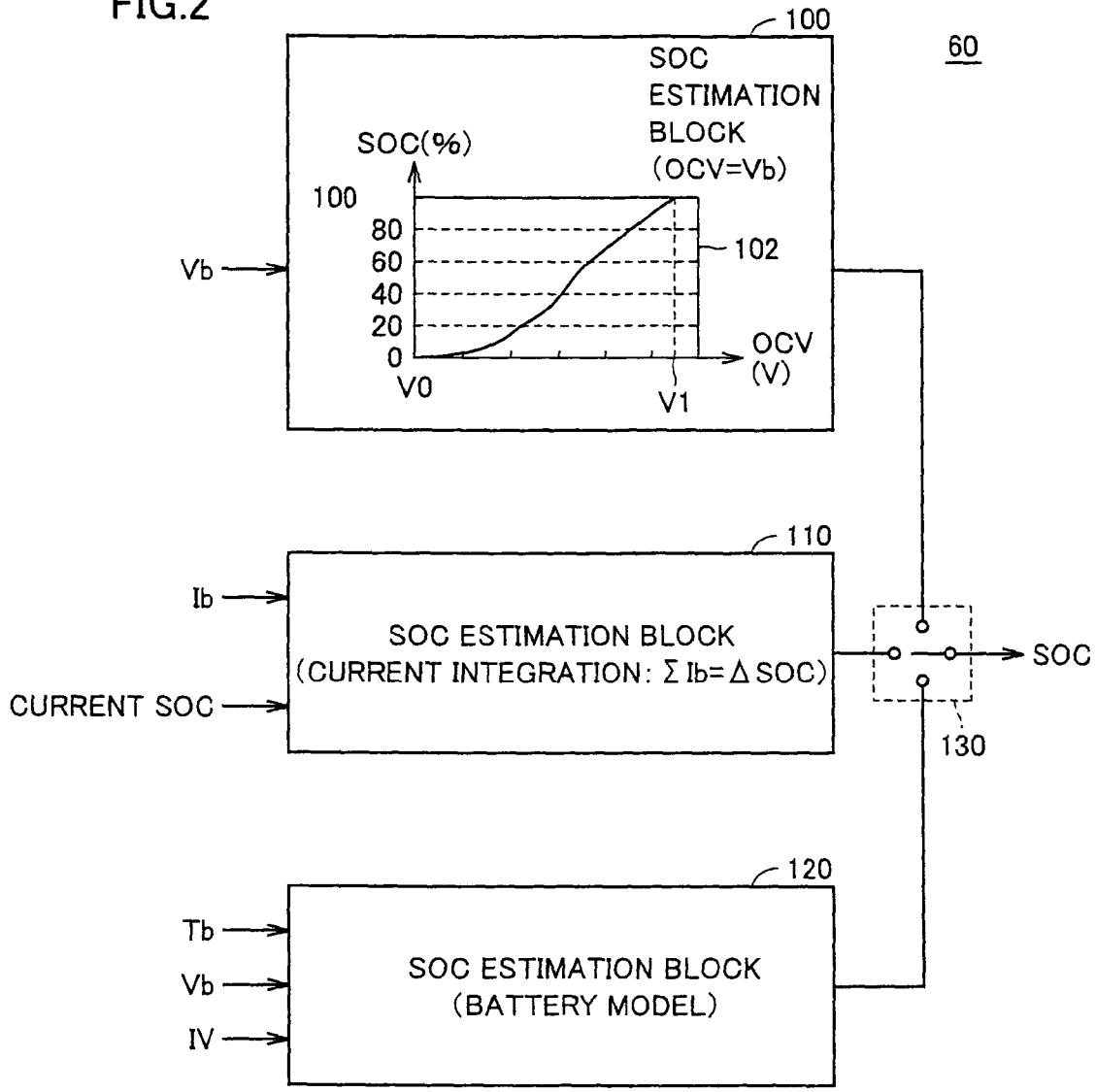
FIG. 2 is a functional block diagram of an SOC estimating unit shown in FIG. 1.

In the embodiment of the present invention, SOC estimating unit 60 estimates SOC by selectively switching among a plurality of SOC estimating procedures in accordance with the state of secondary battery 10, following the functional block diagram of FIG. 2.

Referring to FIG. 2, SOC estimating unit 60 includes SOC estimation blocks 100, 110, 120, and a selection switching unit 130 switching selection among SOC estimation blocks 100 to 120. SOC estimation blocks 100 to 120 estimate SOC by different procedures, in accordance with the input state amount of secondary battery 10. An output of one of the SOC estimation blocks 100 to 120 designated by selection switching unit 130 is output as the estimated remaining capacity (SOC) of SOC estimating unit 60.

In the following, the SOC estimating procedures of respective SOC estimation blocks 100 to 120 will be described in turn.

SOC estimation block 100 has a map 102 storing characteristic relation between open circuit voltage OCV of secondary battery 10 and SOC (%), measured in advance, and estimates SOC of secondary battery 10 by making reference to map 102, regarding battery voltage Vb, which is the voltage across terminals of secondary battery 10, as the open circuit voltage OCV.

SOC estimation block 100 is selected by selection switching unit 130 when battery current Ib is within a stable current range 105 shown in FIG. 3 and is kept continuous for at least a voltage stabilizing time period Ts shown in FIG. 4 (hereinafter also referred to as a stable state).

Figure 3:
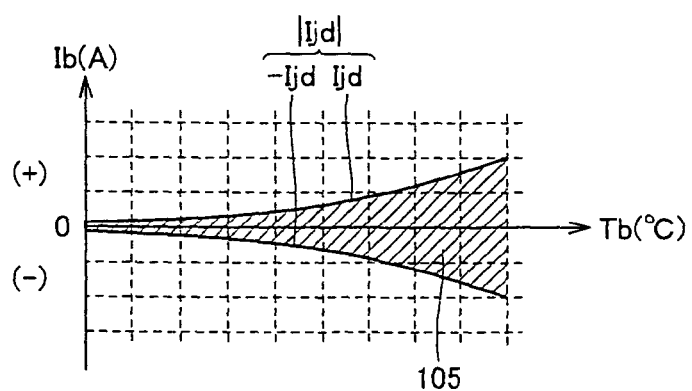
FIG. 3 shows a concept of setting the stable current range.

Referring to FIG. 3, stable current range 105 is defined as the range in which battery current |Ib|<|Ijd|, where |Ijd| is a limit current set in accordance with the battery temperature Tb. The limit current |Ijd| is set larger when the battery temperature increases relatively, and set smaller as the battery temperature Tb decreases relatively.

Figure 5:
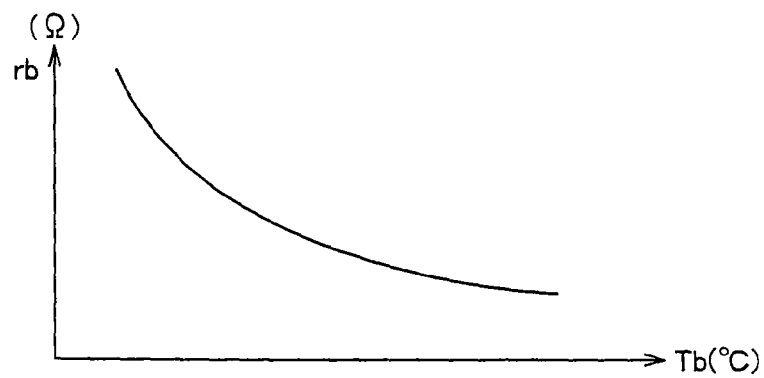
FIG. 5 illustrates concept of temperature dependency of internal resistance of the secondary battery.

This reflects the fact that the internal resistance rd of secondary battery 10 has temperature dependency, and has low resistance in a high temperature range and high resistance in a low temperature range, as shown in FIG. 5. Specifically, as shown in FIG. 3, in correspondence to the temperature dependency of internal resistance rb, limit current |Ijd| is set relatively large as the battery temperature Tb increases and limit current |Ijd| is set relatively small as the battery temperature relatively decreases, whereby the product of internal resistance rb and current limit value |Ijd| can be kept approximately constant (constant voltage). The constant voltage is set in correspondence to the voltage obtained by converting the tolerable SOC estimation error to the open circuit voltage OCV, using map 102.

Consequently, within the stable current range 105, it becomes possible to consider the voltage change rb●|Ib| of internal resistance to be a constant amount or smaller. Therefore, within the stable current range 105, SOC estimation error can be curbed within a prescribed range (tolerable error range) that can be grasped by the setting of limit current |Idj|, even when SOC estimation based on map 102 is executed, regarding battery voltage Vb as the open current voltage OCV.

Figure 6:
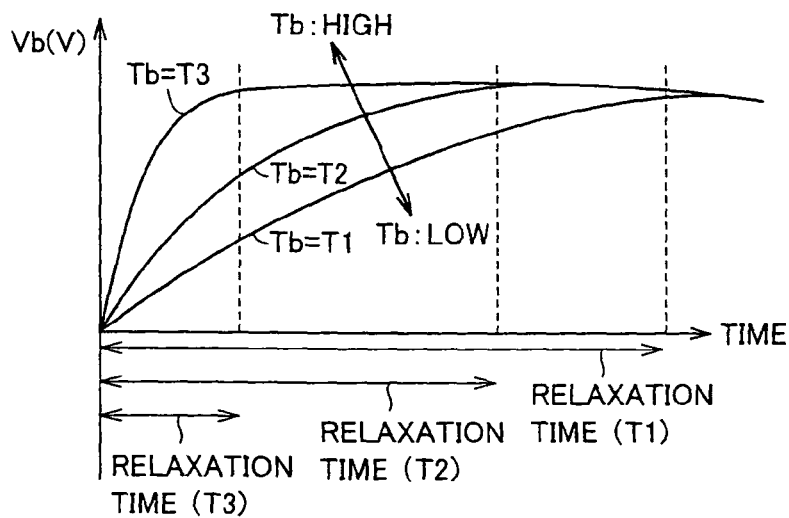
FIG. 6 illustrates concept of temperature dependency of relaxation time of the secondary battery.

Further, as shown in FIG. 6, the change in battery voltage Vb following the change in battery current Ib has a prescribed delay, and the battery voltage Vb stabilizes after the lapse of a prescribed time period referred to as the relaxation time. The relaxation time is known to have temperature dependency. Specifically, as shown in FIG. 6, as the battery temperature Tb attains to a relatively high temperature region (T1→T2→T3), the relaxation time becomes shorter, and if it attains to a relatively low temperature region (T3→T2→T1), the relaxation time becomes longer.

In accordance with the temperature dependency of relaxation time as described above, the battery stabilizing time period Tst is set relatively shorter as the battery temperature Tb increases, and set relatively longer as the battery temperature Tb relatively decreases. Therefore, if the battery current Ib is continued for at least the voltage stabilizing time period Tst, the battery voltage Vb at that time point can be regarded as having a settled, stabilized value.

Therefore, in the stable state in which the battery current Ib is within the stable current range 105 (FIG. 3) and is kept for the voltage stabilizing time period Tst (FIG. 4) or longer, it becomes possible to maintain the SOC estimation error within the tolerable range even if a simple estimation procedure (SOC estimation block 100) is used in which battery voltage Vb is regarded as the open circuit voltage OCV.

Again referring to FIG. 2, SOC estimation block 110 successively estimates SOC of secondary battery 10 by adding SOC change amount ΔSOC to the last calculated SOC value, with the SOC change amount ΔSOC being an integrated value ΣIb of buttery current Ib detected by current sensor 32.

In the SOC estimation based on current integration, the SOC change amount in a short period of time can be estimated with high accuracy. If the SOC estimation is continued for a long period of time, however, bias-like error possibly generates in SOC estimation, because of measurement error (particularly, offset) of current sensor 32. Therefore, it is necessary not to continue SOC estimation based on current integration for a long period of time.

As will be described in the following, SOC estimation block 120 estimates SOC of secondary battery 10 by on-line estimation based on a battery model formed in advance, using state amount of secondary battery 10 detected by a sensor as an input variable. The battery model expression described below is only an example, and any battery model may be used by SOC estimation block 120 provided that the battery model is configured to allow calculation of the open circuit voltage and/or SOC using the state amount (Tb, Vb, Ib or the like) of secondary battery 10 as an input variable.

Figure 7:
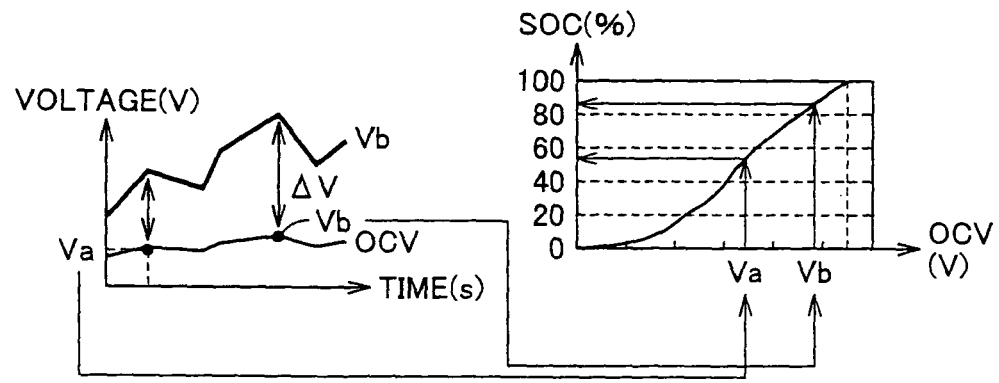
FIG. 7 illustrates an exemplary procedure of SOC estimation based on battery model.

In the present embodiment, as shown in FIG. 7, SOC estimation block 120 estimates voltage change $\Delta V$ of internal resistance of secondary battery 10, using the state amount (Tb, Vb, Ib) of secondary battery 10 as an input variable, and estimates the open circuit voltage (OCV=Vb−$\Delta V$) at that time point. Further, it estimates SOC of secondary battery 10 based on the open circuit voltage-SOC characteristic similar to that of map 102, using the estimated open circuit voltage (Va, Vb of FIG. 7).

Figure 8:
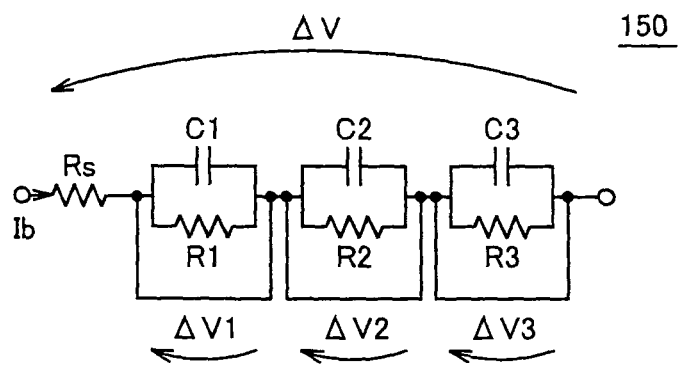
FIG. 8 is a circuit diagram showing an example of the battery model.

Referring to FIG. 8, an equivalent circuit model 150 used in SOC estimation block 120 is an RC serial-parallel circuit model for calculating the voltage difference $\Delta V$=Vb−OCV between the open circuit voltage OCV and battery voltage Vb. In equivalent circuit model 150, Rs represents electrolyte resistance, C1 to C3 represent electrical double layer capacitances, and R1 to R3 represent reaction resistances.

Resistance Rs as the DC resistance component of electrolyte resistance has temperature dependency. Therefore, it is preferred to form a map (not shown) for finding electrolyte resistance Rs using battery temperature Tb as an argument, and to find electrolyte resistance Rs successively.

Similarly, reaction resistances R1 and R3 also have temperature dependency and SOC dependency. Therefore, it is preferred to form in advance a two-dimensional map (not shown) having estimated SOC value and battery temperature Tb at that time point as arguments and to find the reaction resistances R1 to R3 by making reference to the map. Similarly, electrical double layer capacitances C1 to C3 also have temperature dependency and SOC dependency. Therefore, it is preferred to form in advance a two-dimensional map (not shown) having estimated SOC value and battery temperature Tb at that time point as arguments and to find the electrical double layer capacitances C1 to C3 by making reference to the map.

Figure 9:
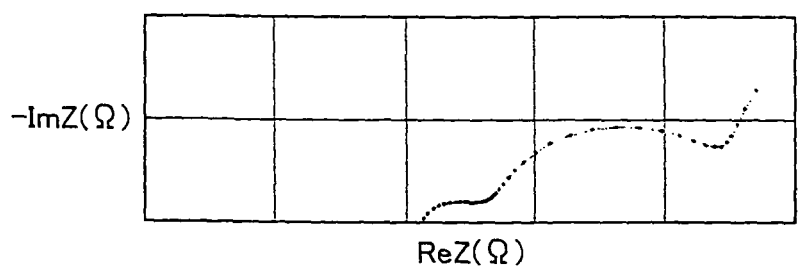
FIG. 9 illustrates an exemplary procedure of calculating a circuit constant in the battery model shown in FIG. 8.

The electrical double layer capacitances C1 to C3 and reaction resistances R1 to R3 in equivalent circuit model 150 may be found beforehand by measuring AC impedance response as a general procedure of evaluating secondary batteries. In AC impedance measurement, AC signals of different frequencies are input as shown in FIG. 9 and real axis component ReZ and imaginary axis component ImZ of the impedance are plotted. From the resulting plotted waveform, the reaction resistances R1 to R3 and electrical double layer capacitances C1 to C3 as AC circuit constants can be obtained.

In equivalent circuit model 150 shown in FIG. 8, the following equation (1) holds.

$$\Delta V = Ib \cdot Rs + \Delta V1 + \Delta V2 + \Delta V3 \qquad (1)$$

Voltage changes $\Delta V1$, $\Delta 2$ and $\Delta V3$ in the RC parallel circuit can be approximated by the following method.

Between the current I (corresponding to battery current Ib in equivalent circuit model 150) and the voltage V (generally representing $\Delta V1$ to $\Delta V3$) in the RC parallel circuit, there is a relation as represented by equation (2) below, where R represents resistance value (generally representing R1 to R3) and C represents capacitor capacitance (generally representing C1 to C3).

$$\frac{1}{C}\left(I - \frac{V}{R}\right) = \frac{dV}{dt} \qquad (2)$$

The differential equation (2) imposes high load on a computer when it is solved on-line. Therefore, the following approximation is used.

By inputting $dV/dt = \Delta V/\Delta t$ to equation (2), the following equation (3) is obtained, where $\Delta V$ represents variation in voltage V in a short time period and $\Delta t$ represents time change.

$$\frac{1}{C}\left(I - \frac{V}{R}\right) = \frac{\Delta V}{\Delta t} \qquad (3)$$

$$\Delta V = \frac{1}{C}\left(I - \frac{V}{R}\right) \cdot \Delta t$$

According to equation (3), by sampling battery current Ib at every prescribed period for each voltage variation $\Delta V1$ to $\Delta V3$, the amount of voltage change from the last calculation to the present calculation can be obtained based on equation (3) using circuit constants C1 to C3 and R1 to R3.

Therefore, $\Delta V1$ to $\Delta V3$ in equation (1) can be obtained in accordance with equations (4) to (6) below. In equations (4) to (6), $\Delta t$ represents calculation period.

$$\Delta V1 = \Delta V1(\text{last value}) + \left\{1 - \frac{\Delta V1(\text{last value})}{R1}\right\} \cdot \frac{\Delta t}{C1} \qquad (4)$$

$$\Delta V2 = \Delta V2(\text{last value}) + \left\{1 - \frac{\Delta V2(\text{last value})}{R2}\right\} \cdot \frac{\Delta t}{C2} \qquad (5)$$

$$\Delta V3 = \Delta V3(\text{last value}) + \left\{1 - \frac{\Delta V3(\text{last value})}{R3}\right\} \cdot \frac{\Delta t}{C3} \qquad (6)$$

In this manner, by performing calculation based on equivalent circuit model 150 at a prescribed period, the voltage change $\Delta V$ of internal resistance with respect to battery voltage Vb can be estimated in accordance with equation (1). Thus, it becomes possible to estimate the open circuit voltage (OCV=Vb−$\Delta V$) at that time point and to estimate SOC based on the open circuit voltage-SOC characteristic.

In the SOC estimation based on battery model, however, large estimation error may possibly occur if the battery current Ib is excessively large. Therefore, it is preferred that SOC estimation based on battery model is performed on condition that the battery current Ib is within a prescribed range.

Next, referring to FIGS. 10 and 11, SOC estimation in accordance with the embodiment of the present invention will be described in detail. It is assumed that the flowcharts of FIGS. 10 and 11 are executed at a prescribed period, in accordance with a prescribed program, by SOC estimating unit 60.

Figure 4:
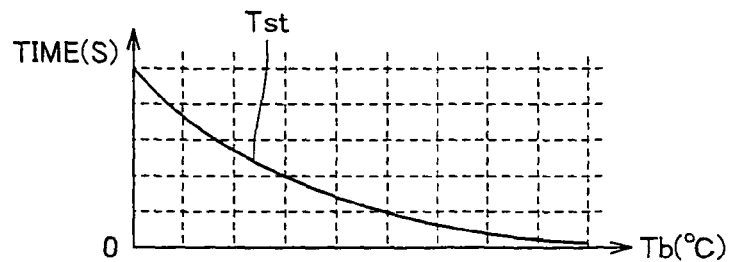
FIG. 4 shows a concept of setting the voltage stabilizing time.
Figure 10:
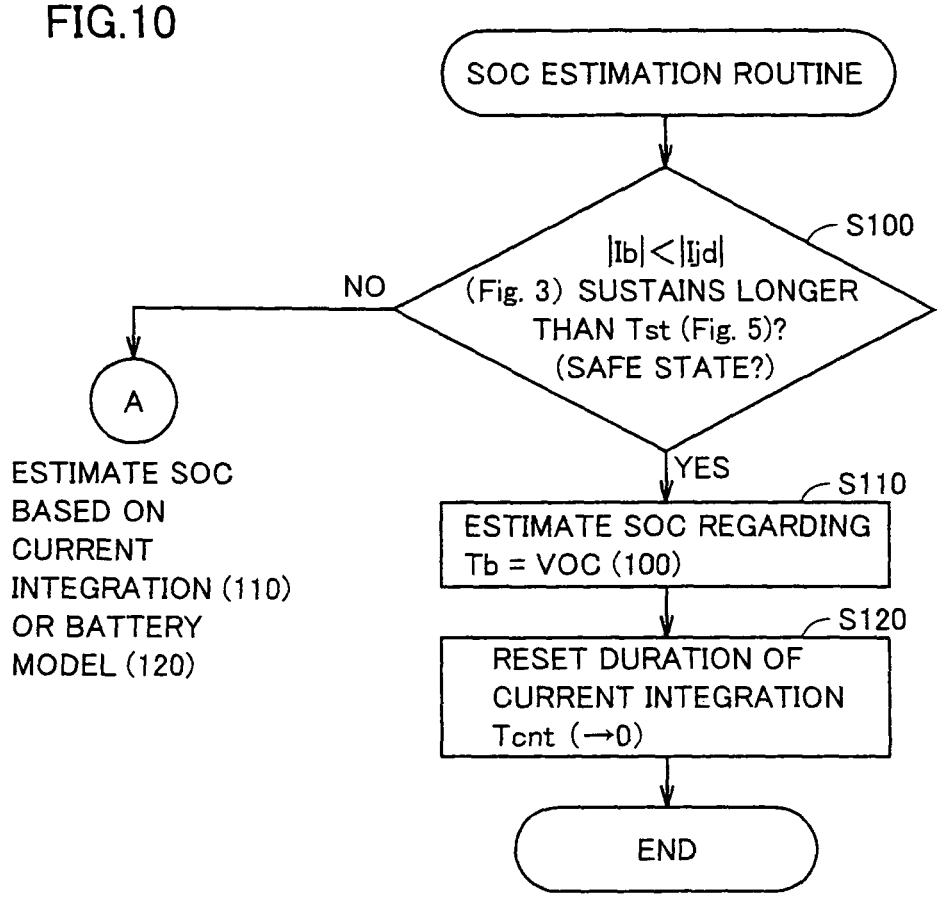
FIG. 10 is a first flowchart representing SOC estimation in accordance with an embodiment of the present invention.
Figure 11:
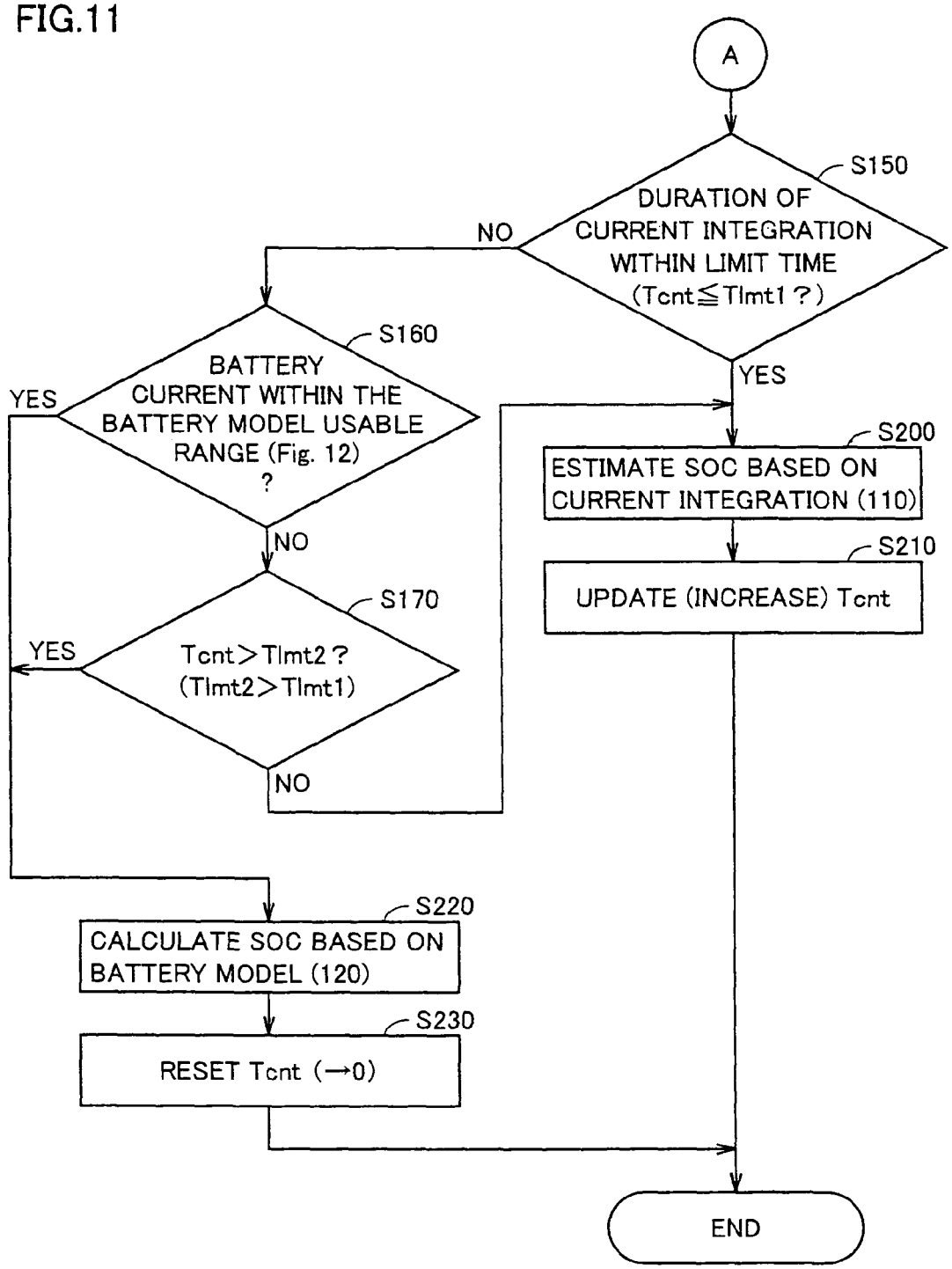
FIG. 11 is a second flowchart representing SOC estimation in accordance with an embodiment of the present invention.

Referring to FIG. 10, in the SOC estimation routine in accordance with the present embodiment, SOC estimating unit 60 determines at step S100 whether battery current Ib is within the stable current range 105 shown in FIG. 3 and kept flowing for at least the voltage stabilizing time period Tst shown in FIG. 4 or not.

When the determination is YES at step S100, SOC estimating unit 60 determines that secondary battery 10 is in a stable state. In the stable state, the SOC estimation error is within the tolerable range even if SOC estimation is done regarding battery voltage Vb as the open circuit voltage OCV. Therefore, when secondary battery 10 is in the stable state, SOC estimating unit 60 performs SOC estimation regarding battery voltage Vb=open circuit voltage OCV at step S110. Specifically, by selection switching unit 130, SOC estimation block 100 is selected.

When SOC estimation is executed by SOC estimation block 100, SOC estimating unit 60 resets, at step S120, a timer value Tcnt for counting the duration of current integration representing the time period in which SOC estimation based on current integration is executed continuously, when SOC estimation based on current integration by SOC estimation block 110 is executed (Tcnt=0).

If the determination is NO at step S100, that is, when secondary battery 10 is not in the stable state, SOC estimating unit 60 performs SOC estimation based on current integration (SOC estimation block 110) or SOC estimation based on battery model (SOC estimation block 120) in accordance with the flowchart of FIG. 11, to estimate SOC.

Referring to FIG. 11, SOC estimating unit 60 determines, at step S150, whether SOC estimation by current integration has been executed exceeding a limit time period Tlmt1 or not. Specifically, at step S150, whether timer value Tcnt<Tlmt1 or not is determined.

If the duration of current integration is within the limit time period Tlmt1 (determination of YES at step S150), SOC estimating unit 60 executes, at step S200, SOC calculation based on current integration by SOC estimation block 110 with priority (step S200). Further, at step S210, SOC estimating unit 60 updates (increases) the timer value Tcnt when SOC estimation based on current integration is executed.

On the contrary, when the determination at step S150 is NO, that is, when SOC estimation based on current integration has been continuously executed for longer than the limit time period Tlmt1, SOC estimating unit 60 determines whether SOC based on battery model (SOC estimation block 120) is to be executed in place of SOC estimation based on current integration or SOC estimation based on current integration (SOC estimation block 110) is to be continued, in accordance with determinations at steps S160 and S170.

Figure 12:
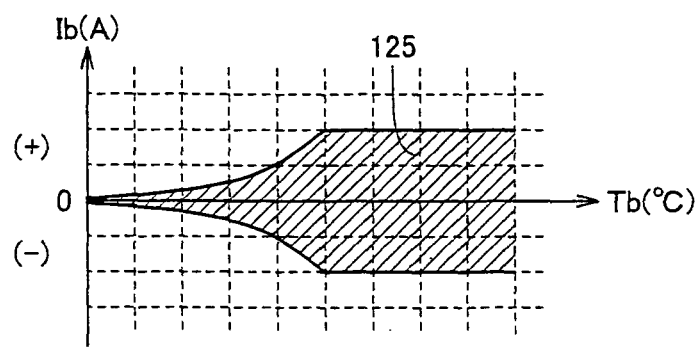
FIG. 12 illustrates setting of a current range that allows SOC estimation based on battery model.

SOC estimating unit 60 determines at step S160 whether the battery current Ib is within the range 125 that allows use of current model shown in FIG. 12 or not.

Referring to FIG. 12, the range 125 that allows use of the current model is set in consideration of the temperature dependency of the internal resistance. Specifically, in the low temperature range where the internal resistance is relatively high and error in estimation based on battery model is likely, the range 125 that allows use of the current model is set to permit SOC estimation on battery model only for the very low current range. In contrast, in the high temperature range where the internal resistance is relatively low and the error in estimation based on battery model is expected to be unlikely, the range 125 that allows use of the current model is set such that SOC estimation based on battery model is permitted if the battery current is within the normal range of use.

Again referring to FIG. 11, if the determination at step S160 is YES, that is, when the battery current Ib is in the range that allows use of the battery model, SOC estimating unit 60 executes SOC estimation based on battery model (SOC estimation block 120) at step S220. When SOC estimation based on battery model is executed, SOC estimating unit 60 resets the timer value Tcnt (Tcnt=0) indicating duration of current integration, at step S230.

On the contrary, if determination at step S160 is NO, that is, when the battery current Ib is out of the range that allows use of the battery model (FIG. 12), SOC estimating unit 60 executes step S170, and determines whether the duration of current integration is within the final limit time period Tlmt2 (Tlmt2>Tlmt1) or not.

The limit time period Tlmt1 and the final limit time period Tlmt2 may be obtained beforehand from the relation between the maximum offset error of current sensor 32 grasped in advance and the tolerable error of SOC estimation. Further, in place of the duration of current integration, determination at steps S150 and S170 may be executed such that the number of discharging operations or time of discharge does not exceed a limit value.

If the determination at step S170 is NO, that is, if the duration of current integration is longer than the limit time period Tlmt1 but not longer than the final limit time period Tlmt2, SOC estimating unit 60 determines that error in SOC estimation based on battery model is larger than the error in SOC estimation caused by continuous current integration, and continues execution of SOC estimation based on current integration at step S200. At this time, SOC estimating unit 60 updates (increases) the timer value Tcnt at step S210.

On the other hand, if the determination at step S170 is YES, that is, if the battery current is outside the range that allows use of the battery model while the duration of current integration exceeded the final limit time period Tlmt2, SOC estimating unit 60 executes SOC estimation based on battery model (SOC estimation block 120) at step S220. Thus, in consideration of increase in error caused by continuing SOC estimation based on current integration, SOC estimation based on battery model is once executed at this time point. Here, SOC estimating unit 60 resets the timer value Tcnt (Tcnt=0) indicating duration of current integration at step S230.

Because of such control structure, if the voltage change in internal resistance is not higher than a prescribed voltage corresponding to the tolerable error of SOC estimation (that is, in the stable state), the SOC of secondary battery 10 can be estimated with tolerable error, in simpler and more reliable manner without using the battery model or the like.

Further, by the limit of duration of current integration in consideration of offset error of current sensor and the limit of use of the battery model in accordance with battery current limitation dependent on battery temperature, the SOC estimation based on battery model and the SOC estimation based on current integration may be selected for use not to increase respective error factors.

Further, in a secondary battery or the like in which correlation between the open circuit voltage and the SOC is not very strong, the process shown in the flowchart of FIG. 10 may be omitted, and SOC estimation may be executed by selecting SOC estimation based on the battery model and the SOC estimation based on current integration.

The present invention is applicable, for example, to estimation of charged state of a secondary battery mounted on a hybrid vehicle or an electric vehicle. In a secondary battery mounted on an electric vehicle, however, charge/discharge control to maintain SOC at a prescribed target value is generally not executed once it is fully charged (SOC≈100%), and correct estimation of decrease in SOC caused by the process of discharge is required, in order to detect necessity of recharging. On the contrary, in a secondary battery mounted on a hybrid vehicle, charge/discharge control is required to maintain SOC at a prescribed target value (for example, SOC=60%), in order to maintain a prescribed margin for charging regenerative power at the time of regenerative braking. Therefore, in a hybrid vehicle, charging/discharging of the secondary battery is repeated frequently and generation of estimation error is notable as compared with the electric vehicle. Therefore, the device and method of estimating charged state in accordance with the present invention is more suitably applicable to a hybrid vehicle.

Here, the relation between the present embodiment and the present invention will be described. The map shown in FIG. 2 corresponds to the "characteristic storing means" of the present invention, and step S100 of FIG. 10 corresponds to the "stable state determining means (stable state determining step)" of the present invention. Further, step S110 corresponds to the "first charged state estimating means (first charged state estimating step)" of the present invention, and steps S200 and S220 of FIG. 11 correspond to the "second charged state estimating means (second charged state estimating step)" of the present invention. Particularly, step S200 corresponds to the "first estimating means (first estimating step)" of the present invention, and step S220 corresponds to the "second estimating means (second estimating step)" of the present invention. Further, steps S120, S210 and S230 of FIG. 11 correspond to the "time measuring means (time measuring step)" of the present invention, and steps S160 and S170 correspond to the "selecting means (selecting step)" of the present invention.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

The invention claimed is:

1. A device for estimating charged state of a secondary battery provided with a detector capable of detecting input/output current, an output voltage and battery temperature, comprising:
   first estimating means for estimating the remaining capacity of said secondary battery by calculating amount of change in said remaining capacity based on an integrated value of said input/output current;
   second estimating means for estimating the remaining capacity of said secondary battery based on a battery model using said input/output current, said output voltage and said battery temperature as input variables;
   timer means for measuring duration of continuous execution of the estimation of remaining capacity by said first estimating means; and
   selecting means for selecting one of said first and second estimating means for estimating said remaining capacity, based on determination as to whether said input/output current is within a prescribed range that allows use of the battery model or not and on said duration of continuous execution obtained by said timer means.

2. The device for estimating charged state of a secondary battery according to claim 1, wherein
   said selecting means estimates said remaining capacity by selecting said first estimating means when said duration of continuous execution is within a first limit time period, and estimates said remaining capacity by selecting said second estimating means when said duration of continuous execution exceeds said first limit time period and said input/output current is in said prescribed range that allows use of the battery model.

3. The device for estimating charged state of a secondary battery according to claim 2, wherein
   said selecting means estimates said remaining capacity by selecting said second estimating means, when said duration of continuous execution exceeds a second limit time period longer than said first limit time period, regardless of said input/output current.

4. The device for estimating charged state of a secondary battery according to claim 2, wherein
   said selecting means estimates said remaining capacity by selecting said first estimating means, when said duration of continuous execution exceeds said first limit time period and said input/output current is out of said prescribed range that allows use of the battery model.

5. The device for estimating charged state of a secondary battery according to claim 1, wherein
   said secondary battery is a lithium ion battery.

6. The device for estimating charged state of a secondary battery according to claim 2, wherein
   said secondary battery is a lithium ion battery.

7. The device for estimating charged state of a secondary battery according to claim 3, wherein
   said secondary battery is a lithium ion battery.

8. The device for estimating charged state of a secondary battery according to claim 4, wherein
   said secondary battery is a lithium ion battery.

9. A method of estimating charged state of a secondary battery provided with a detector capable of detecting input/output current, an output voltage and battery temperature, comprising:
   the first estimating step of estimating the remaining capacity of said secondary battery by calculating amount of change in said remaining capacity based on an integrated value of said input/output current;
   the second estimating step of estimating the remaining capacity of said secondary battery based on a battery model using said input/output current, said output voltage and said battery temperature as input variables;
   the time measuring step of measuring duration of continuous execution of the estimation of remaining capacity by said first estimating step; and
   the selecting step of selecting one of said first and second estimating steps of estimating said remaining capacity, based on determination as to whether said input/output current is within a prescribed range that allows use of the battery model or not and on said duration of continuous execution obtained by said time measuring step.

10. The method of estimating charged state of a secondary battery according to claim 9, wherein
    at said selecting step, said remaining capacity is estimated by selecting said first estimating step when said duration of continuous execution is within a first limit time period, and said remaining capacity is estimated by selecting said second estimating step when said duration of continuous execution exceeds said first limit time period and said input/output current is in said prescribed range that allows use of the battery model.

11. The method of estimating charged state of a secondary battery according to claim 9, wherein
    said secondary battery is a lithium ion battery.

12. The method of estimating charged state of a secondary battery according to claim 10, wherein
    said secondary battery is a lithium ion battery.

* * * * *